United States Patent
Chen et al.

(10) Patent No.: US 7,692,493 B1
(45) Date of Patent: Apr. 6, 2010

(54) HIGH-EFFICIENCY SINGLE TO DIFFERENTIAL AMPLIFIER

(75) Inventors: Chih-Wei Chen, Taipei (TW);
Chuan-Jane Chao, Taipei (TW);
Shyh-Chyi Wong, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 12/356,537

(22) Filed: Jan. 21, 2009

(51) Int. Cl.
*H03F 3/04* (2006.01)
(52) U.S. Cl. ...................... 330/301; 330/117
(58) Field of Classification Search .............. 330/301, 330/253, 275, 117
See application file for complete search history.

(56) References Cited

U.S. PATENT DOCUMENTS 6,825,722 B2 * 11/2004 Segawa ...................... 330/254
6,947,720 B2 * 9/2005 Razavi et al. ............... 455/333
7,282,993 B2 * 10/2007 Okamoto ..................... 330/253

* cited by examiner

*Primary Examiner*—Henry K Choe
(74) *Attorney, Agent, or Firm*—Winston Hsu

(57) ABSTRACT

A high-efficiency single-to-differential amplifier has a first transistor acting as a first amplification stage. A second transistor, a third transistor, a first choke, a second choke, and a first capacitor form a second single-to-differential amplification stage. The first amplification stage receives and amplifies an input signal, outputs the amplified signal to the second single-to-differential amplification stage through a coupling module, and concurrently provides DC bias current to the second single-to-differential amplification stage through a tank. The second single-to-differential amplification stage reuses DC current of the first amplification stage, amplifies the output signal of the first amplification stage, and transfers it to a differential output.

23 Claims, 5 Drawing Sheets

HIGH-EFFICIENCY SINGLE TO DIFFERENTIAL AMPLIFIER

BACKGROUND OF THE INVENTION

1. Field of the Invention

The present invention relates to single-to-differential amplifiers, and more particularly to a high-efficiency single-to-differential amplifier with current reuse.

2. Description of the Prior Art

At present, electronic devices are ubiquitous. They can be found in nearly every place imaginable, including the home, the workplace, vehicles, and even our pockets. And, as electronic device technologies mature, for the same cost, the electronic devices become more portable, use less power, and offer greater functionality. In part, this is due to availability of smaller geometry electronic components, such as transistors and on-chip capacitors. However, novel circuit architectures with improved specifications are also responsible for overall performance gains in the electronic devices.

Amplifiers are a key component in practically every electronic device. They vary broadly in their electrical characteristics, such as gain, bandwidth, and linearity, and vary even more in their application to active filters, buffers, analog-to-digital converters, and RF transceivers.

Different amplifier architectures are necessary for each application. One such amplifier is a single-to-differential amplifier, which is commonly applied in RF circuits as a power amplifier. Please refer to FIG. 1, which is a diagram of a single-to-differential amplifier 100 according to the prior art. The single-to-differential amplifier 100 comprises a first transistor Q1, a second transistor Q2, a first load Z1, a second load Z2, a bias transistor Qb, and a first capacitor C1. The first load Z1 is coupled between a collector of the first transistor Q1 and a first power supply voltage, and the second load Z2 is coupled between a collector of the second transistor Q2 and the first power supply voltage. The first capacitor C1 is coupled between the base of the second transistor Q2 and an AC ground. An emitter of the first transistor Q1 is coupled to an emitter of the second transistor Q2 and a collector of the bias transistor Qb. An emitter of the bias transistor Qb is coupled to a second power supply voltage. A base of the first transistor Q1 takes a single-ended input signal, and the collectors of the first transistor Q1 and the second transistor Q2 output a differential output signal.

In the single-to-differential amplifier 100, a bias current I flows through the first transistor Q1 and the second transistor Q2. Thus, the bias transistor Qb provides a bias current 2I that is double the bias current I. The single-to-differential amplifier 100 is not particularly efficient, since the bias transistor Qb only acts as a current source to provide DC current, and does not provide amplification. Thus, the three transistors Q1, Q2 and Qb form a "one stage" single-to-differential amplifier.

Please refer to FIG. 3, which is a diagram of a single-to-differential low noise amplifier (LNA) according to the prior art. The single-to-differential LNA shown comprises two transistors 301, 302 biased by two current sources 303, 304 connected to voltage supply Vcc, and two current sources 309, 310 connected to ground. A resistor 320 connects emitters of the two transistors 301, 302 as a feedback element. The LNA takes an input at a node INH, and is coupled to AC ground at a node LMD through a capacitor 322. Amplifiers 305, 306 amplify outputs from collectors of the two transistors 301, 302, respectively, and resistors 307, 308 provide negative feedback to ensure constant current at the transistors 301, 302. Use of the resistor 320 and the resistors 307, 308 improves noise performance, and also allows for lower bias current requirements for the two transistors 301, 302.

Please refer to FIG. 4, which is a diagram of a second single-to-differential amplifier 40 according to the prior art. The amplifier 40 comprises a bias circuit 419, which establishes bias currents in a transistor 432 and a transistor 422. A voltage-to-current element 425 converts an input voltage received at a node 423 to an input current. The input current causes differential variations in the currents in the transistor 432 and the transistor 422, which are outputted by diodes 436, 438. The amplifier 40 generates a differential output signal.

The prior art provides a variety of single-to-differential amplifiers, but none is able to provide high efficiency to meet today's technological demands.

SUMMARY OF THE INVENTION

According to an embodiment of the present invention, a high-efficiency single-to-differential amplifier comprises a first transistor, a second transistor, a third transistor, a first choke, a second choke, a first capacitor, a coupling module, an impedance element, and a tank. The first transistor has a first terminal for receiving a matched input signal, a second terminal, and a third terminal. The second transistor has a first terminal, a second terminal for providing a first differential output signal, and a third terminal. The third transistor has a first terminal, a second terminal for providing a second differential output signal, and a third terminal coupled to the third terminal of the second transistor. The first choke is coupled between the second terminal of the second transistor and a first power supply voltage, and may comprise an inductor, an LC tank, a resistor, or an active load. The second choke is coupled between the second terminal of the third transistor and the first power supply voltage, and may also comprise an inductor, an LC tank, a resistor, or an active load. The first capacitor is coupled between the first terminal of the third transistor and AC ground. The coupling module is coupled between the first terminal of the second transistor and the second terminal of the first transistor. The tank is coupled between the third terminal of the second transistor and the second terminal of the first transistor. The impedance element is coupled between the third terminal of the first transistor and the second power supply voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
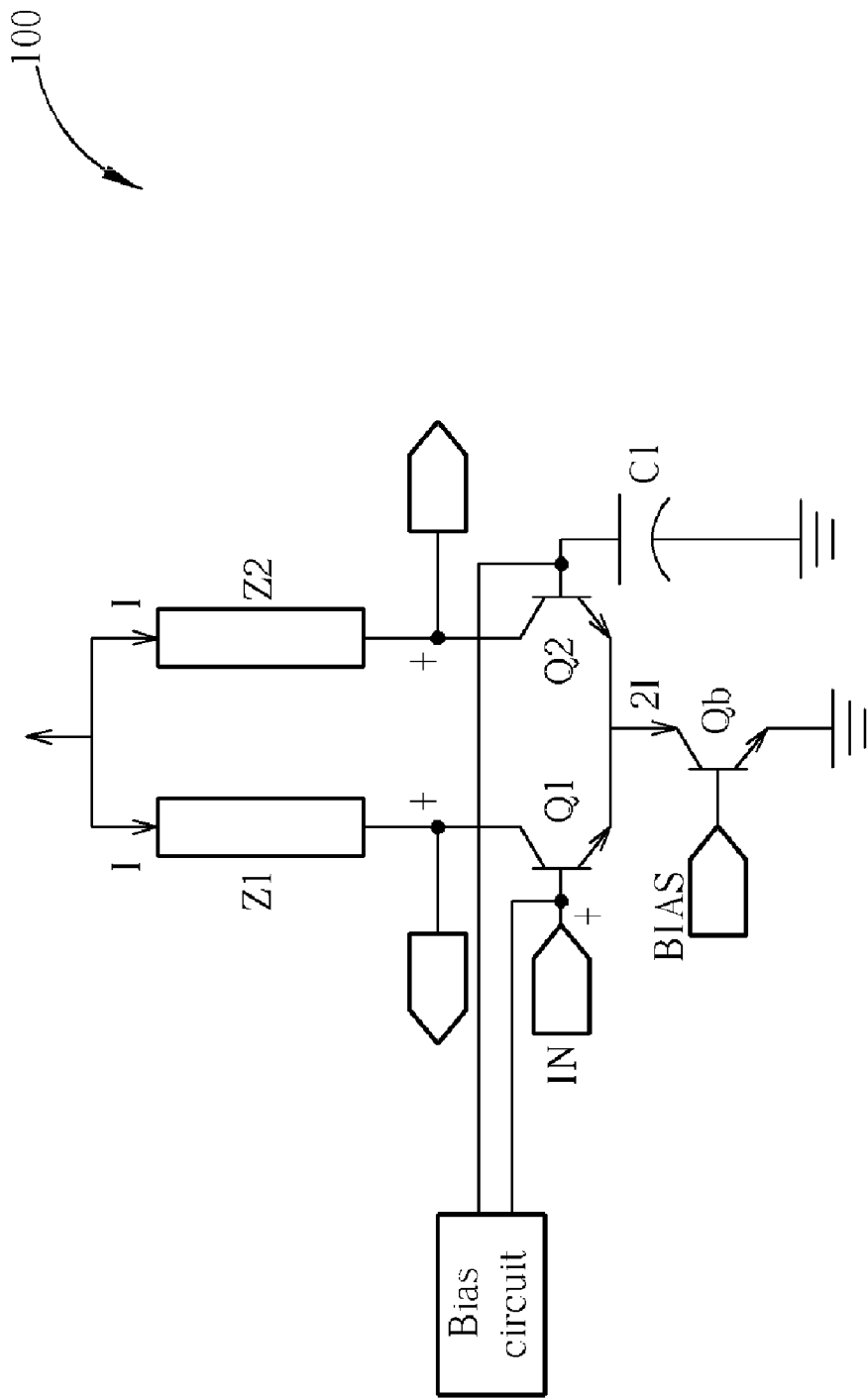
FIG. 1 is a diagram of a single-to-differential amplifier according to the prior art.
Figure 2:
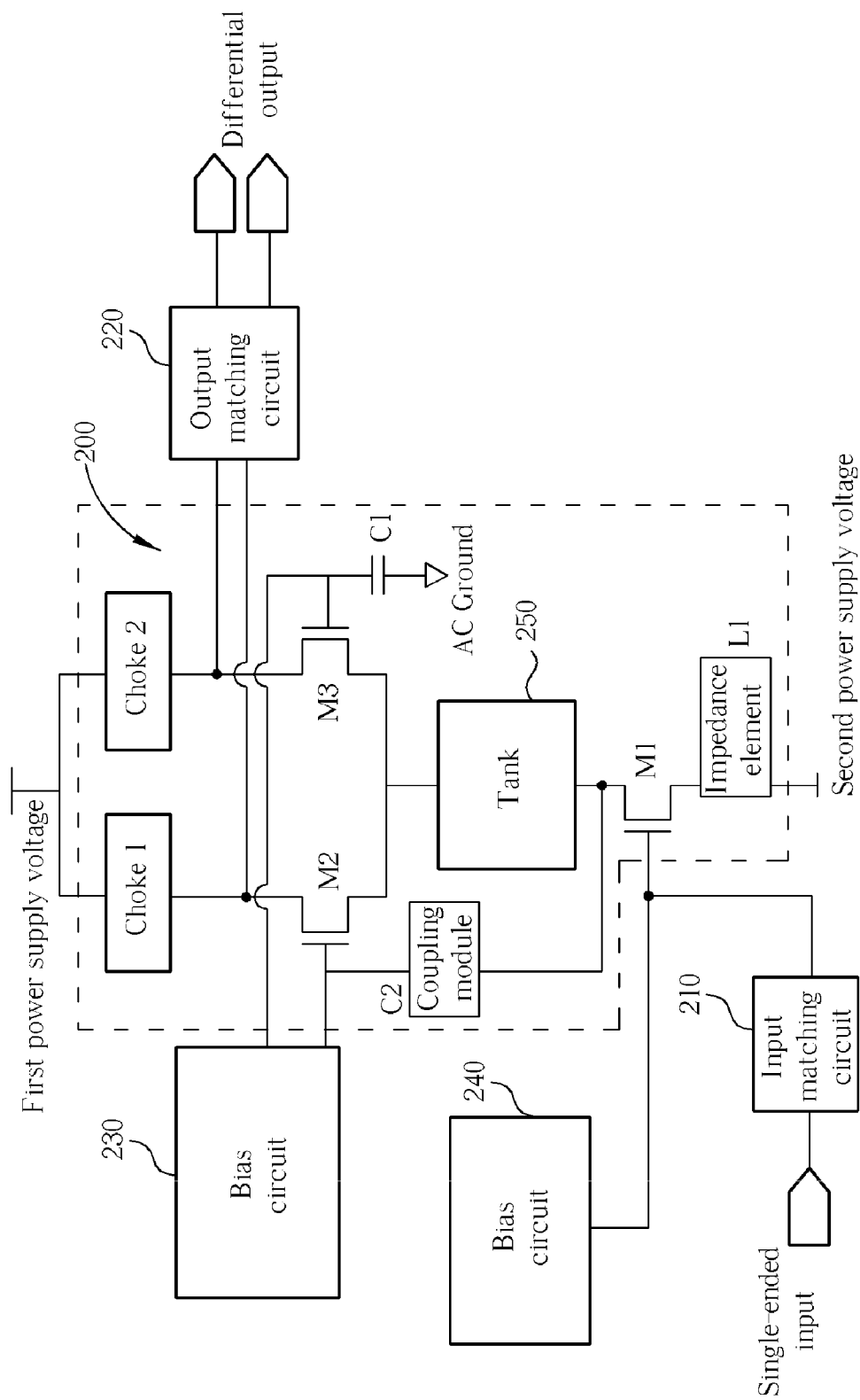
FIG. 2 is a diagram of a single-to-differential amplifier according to an embodiment of the present invention.
Figure 3:
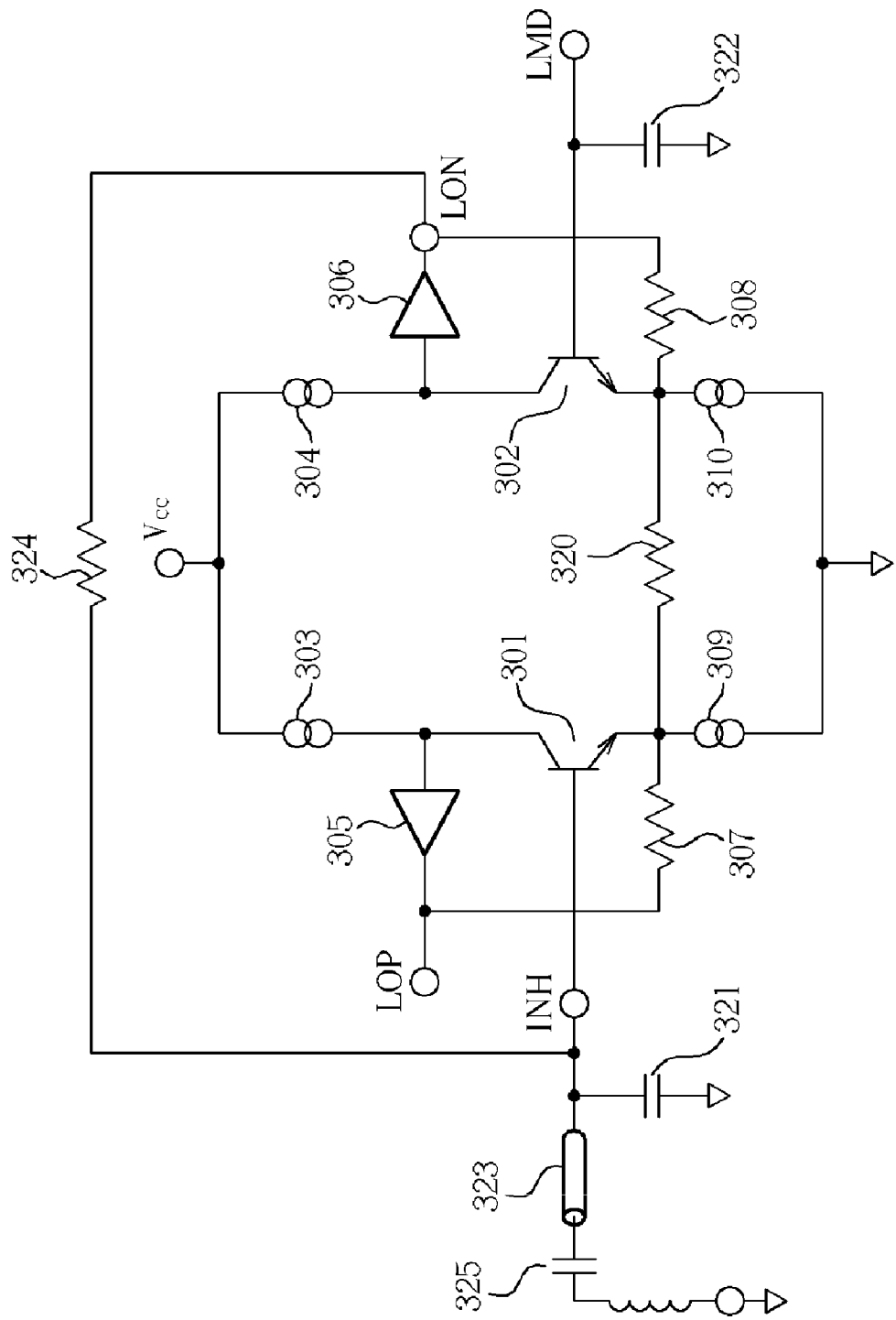
FIG. 3 is a diagram of a single-to-differential low noise amplifier according to the prior art.
Figure 4:
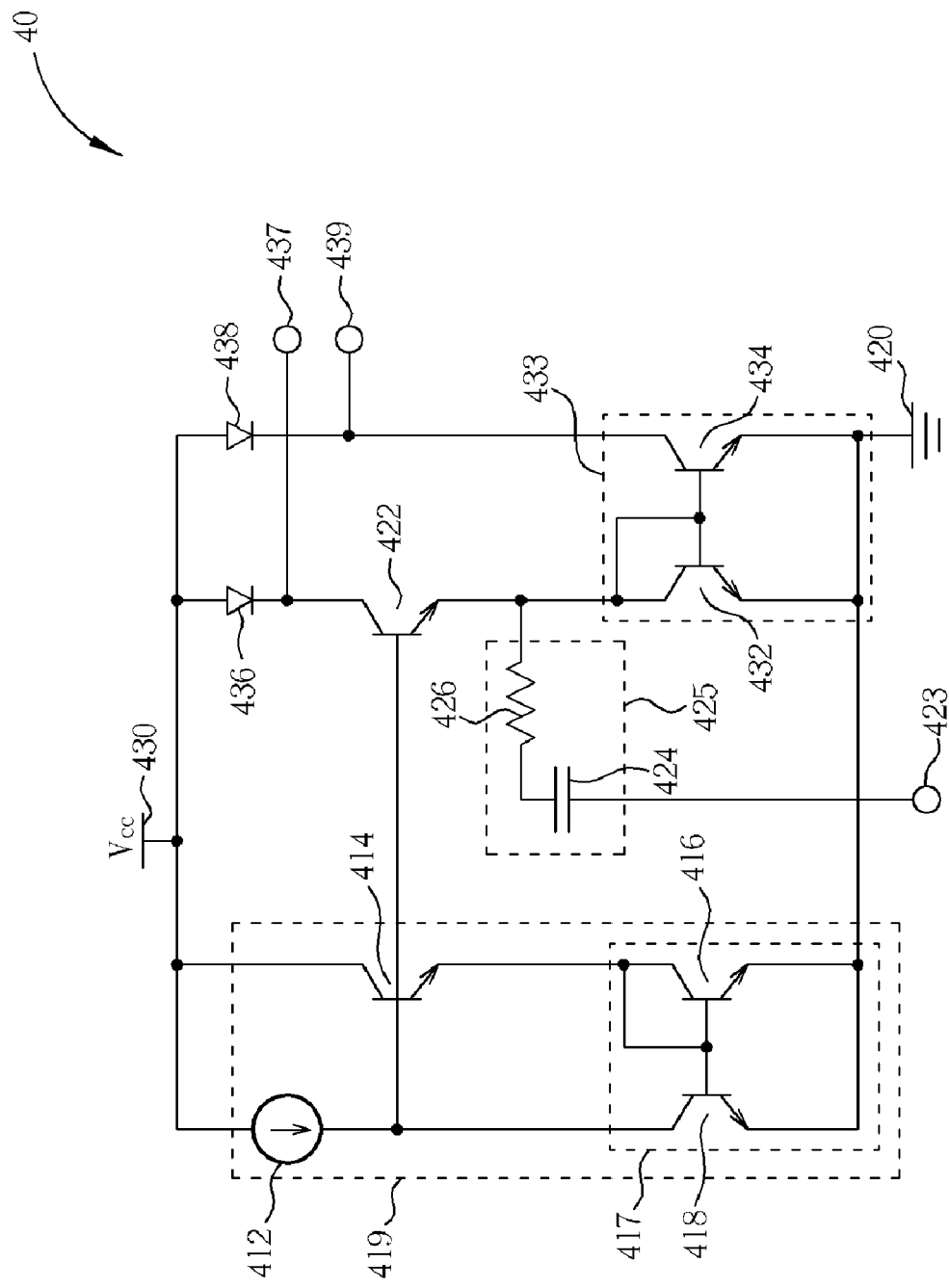
FIG. 4 is a diagram of a second single-to-differential amplifier according to the prior art.

Please refer to FIG. 2, which is a diagram of a high-efficiency single-to-differential amplifier 200 according to one embodiment of the present invention. The amplifier 200 takes a single-ended input through an input matching circuit 210, and outputs a matched output signal through an output matching circuit 220. The amplifier 200 is biased by a first bias circuit 230 and a second bias circuit 240. The amplifier 200 comprises a first transistor M1, which has a source (third) terminal coupled to a second power supply through a first impedance element L1. The first transistor M1 also has a gate (first) terminal coupled to the input matching circuit 210 for receiving the single-ended input, and a drain (second) terminal for outputting a first output signal. The first transistor M1 is biased by the second bias circuit 240. The first impedance element L1 may comprise an inductor, a bonding wire, a down-bond, a microstrip line, a microstrip network, an interconnect line, or a via hole.

The amplifier 200 further comprises a second transistor M2 and a third transistor M3, and a first choke Choke1 and a second choke Choke2. A gate (first terminal) of the second transistor M2 takes the first output signal from the drain of the first transistor M1 through a coupling module C2. The coupling module C2 may be a power coupling network, a capacitor, or a matching network. The drain (second terminal) of the second transistor M2 is coupled to a first power supply through the first choke Choke1. A source (third terminal) of the second transistor M2 is coupled to a source (third terminal) of the third transistor M3. A gate (first terminal) of the third transistor M3 is coupled to AC ground through a first capacitor C1. A drain (second terminal) of the third transistor M3 is coupled to the first power supply through the second choke Choke2. The second transistor M2 and the third transistor M3 are biased by the first bias circuit 230. The drain of the second transistor M2 and the drain of the third transistor M3 are coupled to the output matching circuit 220 for outputting differential output signals. The first choke Choke1 and the second choke Choke2 can each comprise an inductor, an LC tank, an active load, a bonding wire, an interconnect line, a microstrip line, a microstrip network, or a resistor. The second transistor M2 and the third transistor M3 are biased by the first bias circuit 230.

Figure 5:
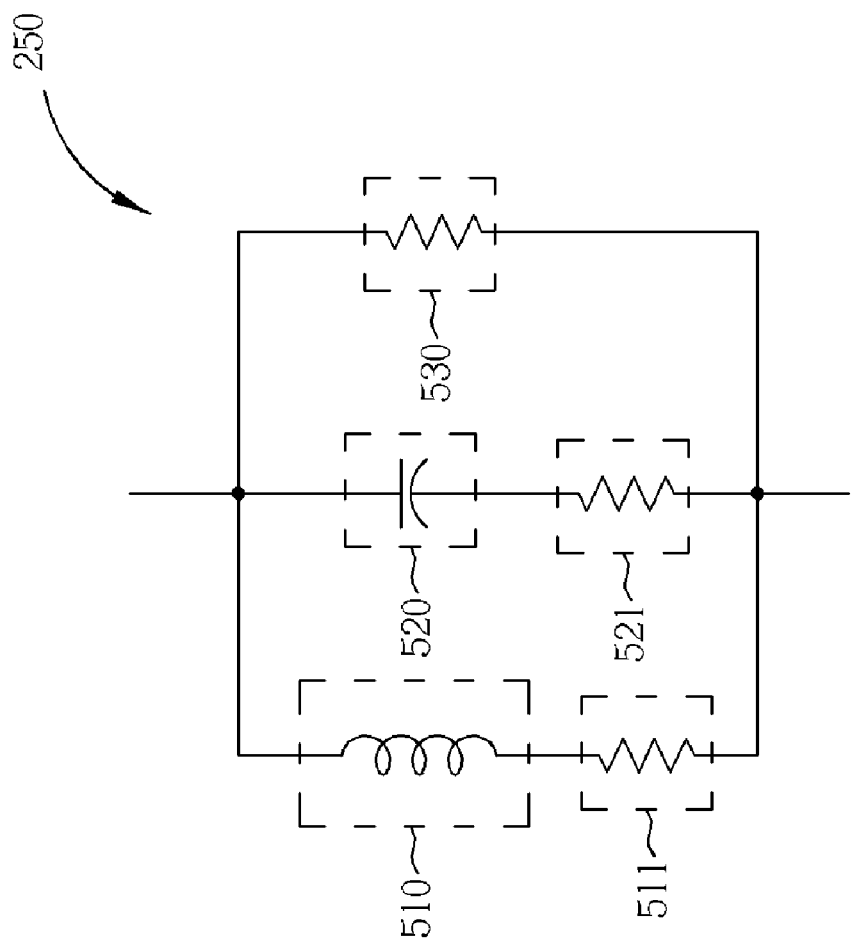
FIG. 5 is a diagram of an embodiment of a tank of FIG. 2.

The sources of the second transistor M2 and the third transistor M3 are coupled to the drain of the first transistor M1 through a tank 250. Please refer to FIG. 5, which is a diagram of the tank 250. As shown in FIG. 5, one implementation of the tank 250 may comprise a parallel combination of an inductor 510 in series with a first resistor 511, a capacitor 520 in series with a second resistor 521, and a third resistor 530. The first resistor 511, the second resistor 521, and the third resistor 530 are all individually optional, and not limitations of the tank 250.

In operation, the first transistor M1 concurrently acts as the first stage amplifier and a DC current source for the second transistor M2 and the third transistor M3, which forms the second stage amplifier that amplifies the output signal of the first transistor M1 through the coupling module C2, and provides single-to-differential transformation. The tank 250 provides high impedance at operation frequency, which decouples high frequency signals between the drain of the first transistor M1 and the common source node of the second transistor M2 and the third transistor M3. The tank 250 also provides low impedance at DC between the drain of the first transistor M1 and the common source node of the second transistor M2 and the third transistor M3, so that the DC current of the first transistor M1 can be reused by the second transistor M2 and the third transistor M3.

The amplifier 200 is more efficient than the prior art, since two-stage amplification is performed consuming the same current as the conventional one-stage single-to-differential amplifier.

It should also be mentioned that the three transistors (M1, M2, M3) may also be implemented in bipolar junction transistor (BJT), heterojunction bipolar transistor (HBT), or metal-semiconductor field-effect transistor (MESFET) technology, and are not limited to metal-oxide-semiconductor field-effect transistor (MOSFET) technology shown in FIG. 2. For example, the respective first, second, and third terminals of the three transistors may be bases, collectors, and emitters in the bipolar technologies. Further, each capacitor of the present invention may be fabricated as a metal-insulator-metal capacitor (MIM), metal-oxide-metal capacitor (MOM), interdigital capacitor (IDC), MOSFET gate capacitor, poly-capacitor, microstrip line capacitor, or junction capacitor, respectively.

In summary, the amplifier 200 employs current reuse in the first transistor M1, the second transistor M2, and the third transistor M3, which increases the efficiency of the amplifier 200 over the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-efficiency single-to-differential amplifier comprising:
    a first transistor having a first terminal for receiving an input signal, a second terminal, and a third terminal coupled to a second power supply;
    a second transistor having a first terminal, a second terminal for providing a first differential output signal, and a third terminal;
    a third transistor having a first terminal coupled to AC ground, a second terminal for providing a second differential output signal, and a third terminal coupled to the third terminal of the second transistor;
    a first choke coupled between the second terminal of the second transistor and a first power supply voltage;
    a second choke coupled between the second terminal of the third transistor and the first power supply voltage;
    a power coupling module coupled between the first terminal of the second transistor and the second terminal of the first transistor; and
    a tank coupled between the second terminal of the first transistor and the third terminal of the second transistor.

2. The high-efficiency single-to-differential amplifier of claim 1 wherein the tank comprises a capacitor and an inductor coupled in parallel.

3. The high-efficiency single-to-differential amplifier of claim 2, wherein the tank further comprises a first resistor coupled in series with the inductor.

4. The high-efficiency single-to-differential amplifier of claim 2, wherein the tank further comprises a second resistor coupled in series with the capacitor.

5. The high-efficiency single-to-differential amplifier of claim 2, wherein the tank further comprises a first resistor coupled in series with the inductor, and a second resistor coupled in series with the capacitor.

6. The high-efficiency single-to-differential amplifier of claim 2, wherein the tank further comprises a third resistor coupled in parallel with the capacitor and the inductor.

7. The high-efficiency single-to-differential amplifier of claim 6, wherein the tank further comprises a first resistor coupled in series with the inductor.

8. The high-efficiency single-to-differential amplifier of claim 6, wherein the tank further comprises a second resistor coupled in series with the capacitor.

9. The high-efficiency single-to-differential amplifier of claim 6, wherein the tank further comprises a first resistor coupled in series with the inductor, and a second resistor coupled in series with the capacitor.

10. The high-efficiency single-to-differential amplifier of claim 1 further comprising a first impedance element coupling the third terminal of the first transistor to the second power supply.

11. The high-efficiency single-to-differential amplifier of claim 10, wherein the first impedance element comprises an inductor, a bonding wire, a down-bond, an interconnect-line, a micro-strip line, a micro-strip network, or a via hole.

12. The high-efficiency single-to-differential amplifier of claim 1, wherein the first choke comprises an inductor, a tank, a resistor, a bonding wire, an interconnect-line, a micro-strip line, a micro-strip network, or an active load.

13. The high-efficiency single-to-differential amplifier of claim 1, wherein the second choke comprises an inductor, a tank, a resistor, a bonding wire, an interconnect-line, a micro-strip line, a micro-strip network, or an active load.

14. The high-efficiency single-to-differential amplifier of claim 1, wherein the first transistor, the second transistor, and the third transistor are all metal-oxide-semiconductor field-effect transistors (MOSFET).

15. The high-efficiency single-to-differential amplifier of claim 1, wherein the first transistor, the second transistor, and the third transistor are all bipolar junction transistors (BJT).

16. The high-efficiency single-to-differential amplifier of claim 1, wherein the first transistor, the second transistor, and the third transistor are all heterojunction bipolar transistors (HBT).

17. The high-efficiency single-to-differential amplifier of claim 1, wherein the first transistor, the second transistor, and the third transistor are all metal-semiconductor field-effect transistors (MESFET).

18. The high-efficiency single-to-differential amplifier of claim 1 further comprising an input matching circuit coupled between the first terminal of the first transistor and an input signal for providing the matched input signal.

19. The high-efficiency single-to-differential amplifier of claim 1 further comprising an output matching circuit coupled to the second terminal of the second transistor and the second terminal of the third transistor for providing the matched output signal.

20. The high-efficiency single-to-differential amplifier of claim 1, wherein the coupling module comprises a capacitor.

21. The high-efficiency single-to-differential amplifier of claim 1, wherein the coupling module comprises a matching network.

22. The high-efficiency single-to-differential amplifier of claim 1, wherein the coupling module comprises a coupling network.

23. The high-efficiency single-to-differential amplifier of claim 1, further comprising a first capacitor coupled between the first terminal of the third transistor and the AC ground.

* * * * *